(12) United States Patent
Gao

(10) Patent No.: US 9,922,950 B2
(45) Date of Patent: Mar. 20, 2018

(54) METHOD AND STRUCTURE FOR WAFER-LEVEL PACKAGING

(71) Applicant: TONGFU MICROELECTRONICS CO., LTD., Nantong (CN)

(72) Inventor: Guohua Gao, Nantong (CN)

(73) Assignee: TONGFU MICROELECTRONICS CO., LTD., Natong (CN)

( * ) Notice: Subject to any disclaimer, the term of this patent is extended or adjusted under 35 U.S.C. 154(b) by 0 days.

(21) Appl. No.: 15/456,350

(22) Filed: Mar. 10, 2017

(65) Prior Publication Data

US 2017/0186717 A1  Jun. 29, 2017

Related U.S. Application Data

(62) Division of application No. 14/971,495, filed on Dec. 16, 2015, now Pat. No. 9,666,550.

(30) Foreign Application Priority Data

Dec. 16, 2014  (CN) .......................... 2014 1 0782466
Dec. 16, 2014  (CN) .......................... 2014 1 0784542

(51) Int. Cl.
*H01L 21/44*  (2006.01)
*H01L 23/00*  (2006.01)
*H01L 23/31*  (2006.01)

(52) U.S. Cl.
CPC .......... *H01L 24/11* (2013.01); *H01L 23/3192* (2013.01); *H01L 24/03* (2013.01); *H01L 24/05* (2013.01); *H01L 24/13* (2013.01); *H01L 2224/0347* (2013.01); *H01L 2224/0391* (2013.01); *H01L 2224/03462* (2013.01); *H01L 2224/0401* (2013.01); *H01L 2224/05547* (2013.01); *H01L 2224/05557* (2013.01); *H01L 2224/05558* (2013.01); *H01L 2224/13026* (2013.01); *H01L 2224/8181* (2013.01)

(58) Field of Classification Search
CPC .......... H01L 24/05; H01L 24/11; H01L 24/13
USPC ............................................... 438/613
See application file for complete search history.

(56) References Cited

U.S. PATENT DOCUMENTS

| | | |
|---|---|---|
| 5,393,697 A | 2/1995 | Chang, et al. |
| 5,656,863 A | 8/1997 | Yasunaga, et al. |
| 5,796,591 A | 8/1998 | Dalal, et al. |
| 5,898,222 A | 4/1999 | Farooq, et al. |
| 5,925,931 A | 7/1999 | Yamamoto |
| 6,201,305 B1 | 3/2001 | Darveaux, et al. |
| 6,614,113 B2 | 9/2003 | Watanabe et al. |
| 7,485,564 B2 * | 2/2009 | Daubenspeck ..... H01L 23/3192 257/E21.508 |

(Continued)

FOREIGN PATENT DOCUMENTS

| | | |
|---|---|---|
| CN | 1604293 A | 4/2005 |
| CN | 101252106 B | 2/2013 |

*Primary Examiner* — Nitin Parekh
(74) *Attorney, Agent, or Firm* — Anova Law Group, PLLC

(57) ABSTRACT

A method for wafer-level packaging includes providing a substrate having a conductive metal pad formed on the surface of the substrate; forming a metal core on the top of the conductive metal pad with the metal core protruding from the surface of the substrate; then, forming an under bump metal layer on the top surface and the side surface of the metal core; and finally, forming a bump structure on the top of the under bump metal layer.

14 Claims, 3 Drawing Sheets

(56) References Cited

U.S. PATENT DOCUMENTS

| | | | |
|---|---|---|---|
| 7,968,445 B2* | 6/2011 | Lin | H05K 3/3436 257/E23.069 |
| 8,130,509 B2* | 3/2012 | Tsai | H01L 24/05 257/529 |
| 2002/0056741 A1 | 5/2002 | Shieh et al. | |
| 2009/0283903 A1* | 11/2009 | Park | H01L 24/03 257/737 |
| 2010/0109160 A1 | 5/2010 | Sakaguchi, et al. | |
| 2010/0163292 A1* | 7/2010 | Tsai | H01L 24/05 174/261 |
| 2010/0230810 A1* | 9/2010 | Kang | H01L 23/49811 257/737 |
| 2011/0266670 A1 | 11/2011 | England et al. | |
| 2011/0278716 A1* | 11/2011 | Hsu | H01L 24/11 257/737 |
| 2012/0256313 A1* | 10/2012 | Guerin | H01L 24/03 257/738 |
| 2013/0075907 A1 | 3/2013 | Pang | |
| 2013/0099372 A1* | 4/2013 | Kuechenmeister | H01L 23/49811 257/737 |
| 2013/0127052 A1* | 5/2013 | Tu | H01L 23/3114 257/738 |
| 2013/0187277 A1* | 7/2013 | Chen | H01L 24/13 257/762 |
| 2014/0203438 A1* | 7/2014 | Chen | H01L 24/05 257/761 |
| 2014/0264843 A1 | 9/2014 | Lin, et al. | |
| 2014/0374899 A1* | 12/2014 | Yang | H01L 23/49811 257/737 |
| 2015/0108634 A1* | 4/2015 | Liu | H01L 24/13 257/737 |
| 2015/0279793 A1* | 10/2015 | Kuo | H01L 24/11 257/737 |

\* cited by examiner

METHOD AND STRUCTURE FOR WAFER-LEVEL PACKAGING

CROSS-REFERENCES TO RELATED APPLICATIONS

This application is a divisional of U.S. patent application Ser. No. 14/971,495, filed on Dec. 16, 2015, which claims the priority of Chinese patent application No. 201410782466.1, filed on Dec. 16, 2014, and Chinese patent application No. 201410784542.2, filed on Dec. 16, 2014, the entirety of all of which is incorporated herein by reference.

FIELD OF THE INVENTION

The present invention generally relates to the field of semiconductor manufacturing technology and, more particularly, relates to a method and a structure for wafer-level packaging.

BACKGROUND

In the conventional technology, connection between integrated circuit (IC) chips and external electric circuit is often realized by using a metal-wire-bonding method.

However, with the reduction of the feature size of IC chips and the expansion of the scale of IC, the wire-bonding method is no longer applicable. Wafer-level chip scale packaging (WLCSP) technology refers to a method in which a whole wafer is packaged and tested before being cut into individual complete chips. Therefore, in the WLCSP technology, the size of the packaged chip is the same as the size of the die. The WLCSP technology has subverted the traditional packaging modes such as ceramic leadless chip carrier, organic leadless chip carrier, etc., and has complied with the increasing market demand on light, small, short, thin, and low-cost microelectronic products. The size of chips packaged by the WLCSP technology reaches a high degree of miniaturization. In the meantime, the cost of the chips is significantly reduced as the size of chips decreases while the size of the wafers increases. The WLCSP technology may be a technique to integrate IC design, wafer fabrication, packaging, and testing together. The WLCSP technology is currently a hot topic in the field of packaging and represents the trend of future development.

FIG. 1 shows a schematic cross-section view of an exemplary chip structure packaged by a WLCSP method in the current technology. Referring to FIG. 1, the chip structure packaged by the method in the current technology includes a semiconductor substrate 1, a conductive metal pad 11 formed on the semiconductor substrate, an under bump metal layer 3 formed on the conductive metal pad 11, and a bump structure 2 located on the top of the under bump metal layer 3.

However, in such a structure, the bump structure 2 may have a relatively small contact region with the under bump metal layer 3, thus resulting in relatively weak bonding strength of the packaged structure. Therefore, the mechanical stability of the packaged structure may also be reduced. For example, the bump structure 2 and the under bump metal layer 3 may be partially or even completely separated from each other and, in the meantime, the electric conductivity and thermal conductivity of the entire packaged structure may also be affected.

The disclosed method and structure for wafer-level packaging is directed to solve one or more problems set forth above and other problems.

BRIEF SUMMARY OF THE DISCLOSURE

One aspect of the present disclosure provides a method for wafer-level packaging. Specifically, the method includes providing a substrate with a conductive metal pad formed on the surface of the substrate; forming a metal core on the top of the conductive metal pad with the metal core protruding from the surface of the substrate; then, forming an under bump metal layer on the top surface and the side surface of the metal core; and finally, funning a bump structure on the top of the under bump metal layer.

Another aspect of the present disclosure provides a packaged semiconductor structure. The packaged semiconductor structure includes a substrate with a conductive metal pad formed on the surface of the substrate, a metal core formed on the top of the conductive metal pad, an under bump metal layer covering the top surface and the side surface of the metal core, and a bump structure formed on the surface of the under bump metal layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
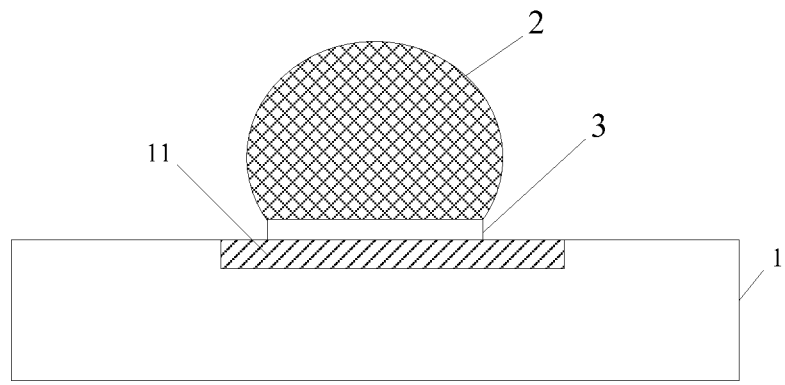
FIG. 1 illustrates a schematic cross-section view of a chip structure packaged by a conventional method.

FIG. 1 shows a schematic view of a chip structure packaged by a conventional method. Referring to FIG. 1, as detailed in the above background section, the bonding strength between the bump structure 2 and the under bump metal layer 3 may not be strong enough due to a relatively small contact region between the bump structure 2 and the under bump metal layer 3 and, thus, the mechanical stability of the packaged structure may be reduced. For example, the bump structure 2 and the under bump metal layer 3 may be partially or even completely separated from each other and, in the meantime, the electric conductivity and thermal conductivity of the entire packaged structure may also be affected.

Figure 7:
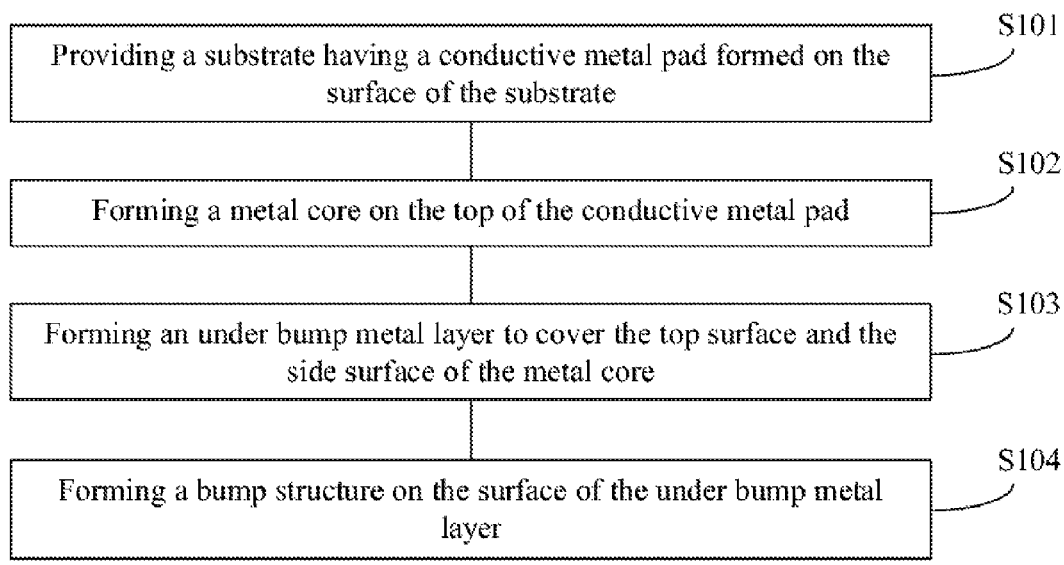
FIG. 7 illustrates a flowchart of an exemplary wafer-level packaging process consistent with the disclosed embodiments.

The present disclosure provides a wafer-level packaging method. FIG. 7 shows a flowchart of an exemplary wafer-level packaging process consistent with the disclosed embodiments.

Figure 2:
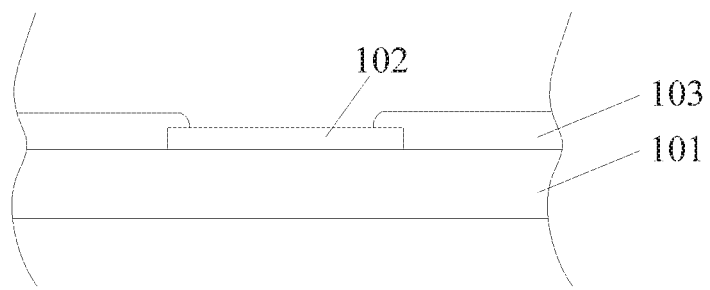
FIGS. 2-6 illustrate schematic cross-section views of semiconductor structures corresponding to certain stages of the fabrication process consistent with disclosed embodiments.
Figure 3:
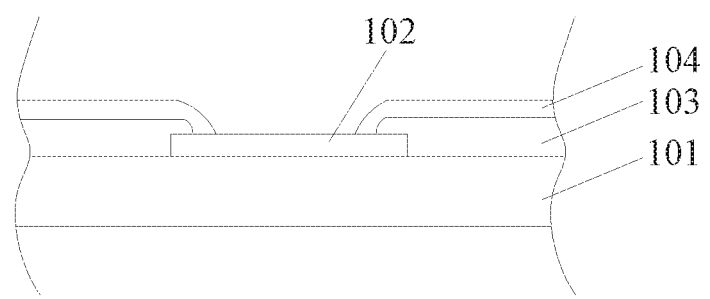

Referring to FIG. 7, at the beginning of the packaging process, a substrate is provided (S101). FIGS. 2-3 show corresponding structures.

Referring to FIG. 2, a substrate 101 is provided. In one embodiment, the substrate 101 is a semiconductor wafer with a number of semiconductor devices such as transistors formed in the wafer.

A conductive metal pad 102 may be formed on the surface of the substrate 101. The conductive metal pad 102 is used to lead out electric characteristics in the substrate 101 to the surface of the substrate 101 in order to facilitate the subsequent packaging process.

In one embodiment, a passivation layer 103 may also be formed on the surface of the substrate 101. The passivation layer 103 is used to protect the surface of the substrate 101.

A hole may be formed in the passivation layer 103 to expose the surface of the conductive metal pad 102, such that the passivation layer 103 may not affect the electrical connection between the conductive metal pad 102 and a subsequently-formed bump structure.

The passivation layer 103 may be made of any appropriate material such as SiN, borosilicate glass (BSG), phosphorosilicate glass (PSG), or boron-phosphorosilicate glass (BPSG).

In one embodiment, the thickness of the passivation layer may be in a range of 1~2 μm. In certain other embodiments, the thickness of the passivation layer may be decided based on the actual demand.

Referring to FIG. 3, in one embodiment, a protective layer 104 may be formed on the top of the passivation layer 103.

The protective layer 104 may provide additional protection for the substrate 101 and the passivation layer 103 formed on the substrate 101. Usually the passivation layer 103 is made of a relatively brittle material (for instance, in one embodiment, the passivation layer is made of SiN, BSG, PSG, or BPSG) and, thus, may easily break. Therefore, forming the protective layer 104 on the top of the passivation layer 103 may help to protect the substrate 101 and the passivation layer 103.

In addition, the protective layer 104 may also help to planarize the surface of the passivation layer 103. Usually, the passivation layer 103 is relatively thin while the surface of the substrate 101 may have a considerable number of bumps. For example, a plurality of semiconductor devices may be formed on the surface of the substrate 101. Therefore, after forming the passivation layer 103, the surface of the substrate 101 may be still uneven, thus subsequent formation of an under bump metal layer and a bump structure may be affected. By forming the protective layer 104, the surface of the substrate 101 may be planarized. Therefore, the formation of the under bump metal layer and the bump structure in subsequent processes may be facilitated.

The protective layer 104 may not cover the conductive metal pad 102. That is, the surface of the conductive metal pad 102 may be exposed to avoid the protective layer 104 affecting the electric connection between the conductive metal pad 102 and the subsequently-formed bump structure.

The conductive metal pad 102, the passivation layer 103, and the protective layer 104 together form an opening. Specifically, the bottom surface of the opening is the exposed surface of the conductive metal pad 102 while the sidewall of the opening is finned by a portion of the passivation layer 103 and the protective layer 104 on the surface of the conductive metal pad 102 near the edge of the conductive metal pad 102. The position of the opening defines the position of a subsequently-formed metal core.

In one embodiment, the protective layer 104 is made of a polyimide material. Polyimide material not only has ideal elasticity but also has a relatively firm texture. Therefore, using such a material to form the protective layer 104 may further help the protection on the substrate 101 and the passivation layer 103.

In one embodiment, the protective layer 104 may be in a range of 4~6 μm. Such a thickness range may help to fill and level up the surface of the substrate 101 using the covering layer, i.e. the passivation layer 103. In the meantime, such a thickness range may not be too thick so that the volume of the entire packaged structure increases.

Figure 4:
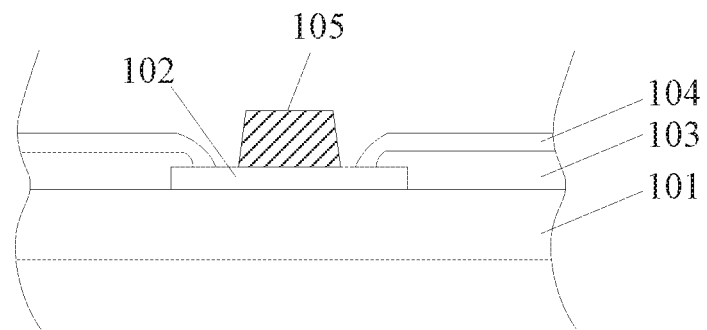

Returning to FIG. 7, a metal core protruding from the surface of the substrate may be formed on the uncovered surface of the conductive metal pad (S102). FIG. 4 shows a corresponding semiconductor structure.

Referring to FIG. 4, the metal core 105 is used to improve the bonding strength between a subsequently-formed bump structure and a subsequently-formed under bump metal layer.

Specifically, because the metal core 105 protrudes from the surface of the substrate 101, when the subsequently-formed under bump metal layer covers the top surface and the side surface of the metal core 105, the contact region between the under bump metal layer and the bump structure may be increased and the under bump metal layer may extend into the bump structure. Therefore, the bonding strength between the under bump metal layer and the bump structure may increase, the combined structure of the under bump metal layer and the bump structure may be more stable, and the bump structure may unlikely come off from the under bump metal layer. Thus, the structure may further improve the mechanical stability of the packaged structure and also increase the thermal conductivity and the electric conductivity of the packaged structure.

In one embodiment, the protective layer 104 is formed on the surface of the substrate 101 while the conductive metal pad 102 the passivation layer 103, and the protective layer 104 together form an opening. Therefore, the metal core 105 may be formed on the bottom surface of the opening.

In one embodiment, the surface of the metal core 105 may be no lower than the surface of the protective layer 104, thus every part of the surface of the subsequently-formed under bump metal layer may be higher than or leveled with the surface of the protective layer 104. Instead, the under bump metal layer may protrude from the surface of the protective layer 104, thus achieving a goal to have the under bump metal layer extended into the bump structure.

Further, referring to FIG. 4, the metal ore 105 is formed on the surface of the conductive metal pad 102, but is not directly in contact with the passivation layer 103 and the protective layer 104. That is, there is a spatial interval separating the sidewall of the metal core 105 from the passivation layer 103 and the protective layer 104. In addition, a subsequently-formed under bump metal layer may fill into the spatial interval.

In one embodiment, the metal core 105 may be formed through the following procedures.

First, an electroplating seed layer may be formed on the substrate 101. The electroplating seed layer may be formed by any appropriate method. For example, in one embodiment, the electroplating seed layer is formed by using a sputtering method.

Then, a photo-resist layer may be formed on the top of the electroplating seed layer. The photo-resist layer is used to cover a portion of the electroplating seed layer during a subsequent process to form the metal core 105. Specifically, the covered portion of the electroplating seed layer by the photo-resist layer corresponds to regions with no metal core 105 to be formed on in a subsequent process.

Further, a portion of the photo-resist layer may be removed to expose the surface of the electroplating seed layer located on the top of the conductive metal pad 102.

Moreover, an electroplating process may be performed on the surface of the substrate 101 to form the metal core 105. Because the surface of the electroplating seed layer on the top of the conductive metal pad 102 is exposed, the metal core 105 may then be formed on the top of the electroplating seed layer located on the top of the conductive metal pad 102.

Finally, the photo-resist layer and the electroplating seed layer under the photo-resist layer may be removed to complete the formation of the metal core 105.

The photo-resist layer may be removed by any appropriate solvent. The electroplating seed layer may be removed by a dry etching or a wet etching process with a patterned mask layer to cover the metal core 105 during the etching process.

Alternatively, a photo-resist layer with an opening may be formed prior to forming an electroplating seed layer. The opening in the photo-resist layer is formed on the top of the exposed surface of the conductive metal pad 102. The dimension of the opening defines the dimension of the metal core 105 to be formed. Then, an electroplating seed layer may be formed to cover the photo-resist layer and the surface of the conductive metal pad 102 exposed in the opening. Further, an electroplating process may be performed to form the material of the metal core 105. Finally, after a lift-off process, the metal core 105 protruding from the conductive metal pad 102 is formed.

In one embodiment, the metal core 105 may be made of Cu, Au, Ag, Sn, or Ni.

Figure 5:
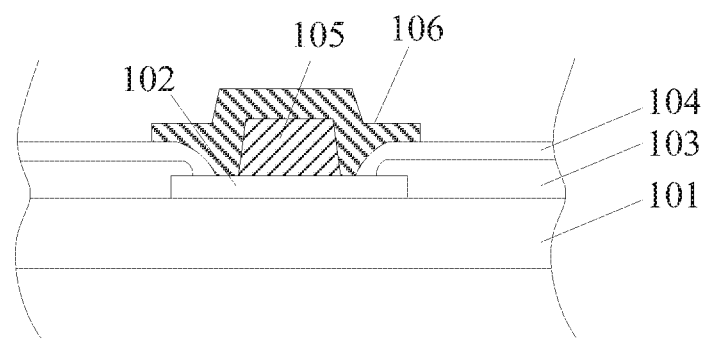

Returning to FIG. 7 after forming the metal core 105, an under bump metal layer 106 may be formed on the top surface and the side surface of the metal core 105 (S103). FIG. 5 shows a corresponding structure with the under metal layer 106 covering the tope surface and the side surface of the metal core 105. The under bump metal layer 106 is used to define the position of a subsequently-formed bump structure.

As described above, the under bump metal layer 106 covers the top surface and the side surface of the metal core 105. That is, the metal core 105 covered by under bump metal layer 106 also protrudes from the surface of the protective layer 104, thus the contact region between the subsequently-formed bump structure and the under bump metal layer 106 may be increased. In the meantime, a portion of the metal core 105 covered by the under bump metal layer 106 may extend into the bump structure. Therefore, the combined structure of the under bump metal layer 106 and the bump structure may be more stable and the bump structure may unlikely come off from the under bump metal layer 106, and the structure may further improve the mechanical stability of the packaged structure and also increase the thermal conductivity and the electric conductivity of the packaged structure.

In one embodiment, the under bump metal layer 106 is formed by using an electroplating method. In addition, the under bump metal layer 106 is made of Cu, Au, Ag, Sn, or Ni.

Further, the material used to form the under bump metal layer 106 is different from the material used to form the metal core 105 so that when the two metals contact with each other, atoms in one material may diffuse into the other, and vice versa. Therefore, an intermetallic compound (IMC) may be formed at the interface of the two metallic materials, thus may further improve the bonding strength between the two metals. That is, the bonding strength between the under bump metal layer 106 and the metal core 105 may be further improved.

Figure 6:
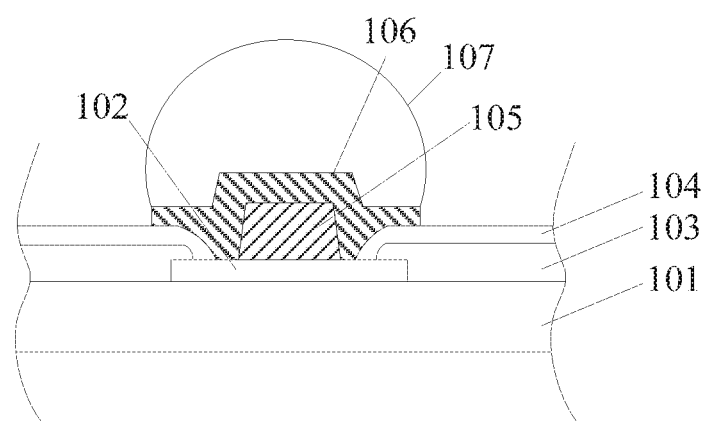

Further, returning to FIG. 7, a bump structure may be formed on the surface of the under bump metal layer (S104). FIG. 6 shows a corresponding structure with the bump structure 107 formed on the surface of the under bump metal layer 106.

In one embodiment, referring to FIG. 6, the bump structure 107 is a spherical bump structure, i.e., a soldering ball. In certain other embodiments, the bump structure 107 may have a different shape. For example, the bump structure 107 may have a cylindrical profile.

In one embodiment, the bump structure 107 is formed by using a ball-planting and back-flow method. The bump structure 107 may be made of Cu, Au, AG, Sn, or Ni. Further, the material used to form the bump structure 107 is different from the material used to form the under bump metal layer 106. For a similar purpose of using different materials to form the under bump metal layer 106 and the metal core 105, using different materials to form the bump structure 107 and the under bump metal layer 106 may lead to formation of an intermetallic compound (IMC) at the interface of the two metallic materials. Thus, the bonding strength between the bump structure 107 and the under bump metal layer 106 may be further improved.

The present disclosure also provides a packaged semiconductor structure. FIG. 6 shows a schematic cross-section view of a packaged semiconductor structure consistent with the disclosed embodiments.

Referring to FIG. 6, the packaged semiconductor structure includes a substrate 101. A conductive metal pad 102 may be formed art the surface of the substrate 101. The conductive metal pad 102 is used to lead out the electric characteristics in the substrate 101 to the surface of the substrate 101 in order to facilitate the subsequent packaging process.

In one embodiment, a passivation layer 103 is formed on the surface of the substrate 101. The passivation layer 103 is used to protect the surface of the substrate 101.

The conductive metal pad 102 may be exposed in a hole formed in the passivation layer 103, thus the passivation layer 103 may not affect the electric connection between the conductive metal pad 102 and a subsequently-formed bump structure 107.

The passivation layer 103 may be made of any appropriate material such as SiN, borosilicate glass (BSG), phosphorosilicate glass (PSG), or boron-phosphorosilicate glass (BPSG).

In one embodiment, the thickness of the passivation layer may be in a range of 1~2 μm. In certain other embodiments, the thickness of the passivation layer may be decided based on the actual demand.

Further, a protective layer 104 may be formed on the surface of the passivation layer 103. The protective layer 104 may provide additional protection for the substrate 101 and the passivation layer 103 formed on the substrate 101. Usually the passivation layer 103 is made of a relatively brittle material (for instance, in one embodiment, the passivation layer is made of SiN, BSG, PSG, or BPSG), thus may easily break. Therefore, forming the protective layer 104 on the top of the passivation layer 103 may help to protect the substrate 101 and the passivation layer 103.

Moreover, the protective layer 104 may also help to planarize the surface of the passivation layer 103. Usually, the passivation layer 103 is relatively thin while the surface of the substrate 101 may have a considerable number of bumps. For example, a plurality of semiconductor devices may be formed on the surface of the substrate 101. Therefore, after forming the passivation layer 103, the surface of the substrate 101 may be still uneven, thus subsequent formation of an under bump metal layer 106 and a bump structure 107 may be affected. By forming the protective layer 104, the surface of the substrate 101 may be planarized, therefore the formation of the under bump metal layer 106 and the bump structure 107 in subsequent processes may be facilitated.

The protective layer 104 may not cover the conductive metal pad 102. That is, the surface of the conductive metal pad 102 may be exposed to avoid the protective layer 104 affecting the electric connection between the conductive metal pad 102 and the subsequently-formed bump structure 107.

In one embodiment, the protective layer 104 may be made of a polyimide material. Polyimide material not only has ideal elasticity but also has a relatively firm texture. Therefore, using such a material to form the protective layer 104 may further help the protection on the substrate 101 and the passivation layer 103.

In one embodiment, the protective layer 104 may be in a range of 4~6 μm. Such a thickness range may help to fill and level up the surface of the substrate 101 using the covering layer, i.e. the passivation layer 103. In the meantime, such a thickness range may not be too thick so that the volume of the entire packaged structure increases.

Referring to FIG. 6, the packaged semiconductor structure further includes a metal core 105. The metal core 105 is formed on the surface of the conductive metal pad 102 and protrudes from the surface of the substrate 101. However, the metal core 105 is not directly in contact with the passivation layer 103 and the protective layer 104. That is, there is a spatial interval separating the sidewall of the metal core 105 from the passivation layer 103 and the protective layer 104. In addition, a subsequently-formed under bump metal layer 106 may fill into the spatial interval. The metal core 105 is used to improve the bonding strength between the bump structure 107 and the under bump metal layer 106 formed in subsequent processes.

Specifically, because the metal core 105 protrudes from the surface of the substrate 101, when the subsequently-formed under bump metal layer 106 covers the top surface and the side surface of the metal core 105, the contact region between the under bump metal layer 106 and the bump structure 107 increases and the under bump metal layer extends into the bump structure 107. Therefore, the bonding strength between the under bump metal layer 106 and the bump structure 107 may increase, the combined structure of the under bump metal layer 106 and the bump structure 107 may be more stable, and the bump structure 107 may unlikely come off from the under bump metal layer 106, thus the structure may further improve the mechanical stability of the packaged structure and also increase the thermal conductivity and the electric conductivity of the packaged structure.

In one embodiment, because the protective layer 104 is formed on the surface of the substrate 101, the surface of the metal core 105 may not be lower than the surface of the protective layer 104, thus every part of the surface of the subsequently-formed under bump metal layer 106 may not be lower than or leveled with the surface of the protective layer 104. Instead, the under bump metal layer 106 may protrude from the surface of the protective layer 104, thus achieving a goal to have the under bump metal layer 106 extended into the bump structure 107.

In one embodiment, the metal core 105 may be made of Cu, Au, Ag, Sn, or Ni.

Referring to FIG. 6, the packaged semiconductor structure also includes an under bump metal layer 106 formed to cover the top surface and the side surface of the metal core 105. The under bump metal layer 106 may also fill into the spatial interval between the sidewall of the metal core and the protective layer 104. The under bump metal layer 106 is used to define the position of the subsequently-formed bump structure 107.

As described above, the under bump metal layer 106 covers the top surface and the side surface of the metal core 105. That is, the metal core 105 covered by under bump metal layer 106 also protrudes from the surface of the protective layer 104, thus the contact region between the subsequently-formed bump structure 107 and the under bump metal layer 106 may be increased. In the meantime, a portion of the metal core 105 covered by the under bump metal layer 106 may extend into the bump structure 107. Therefore, the combined structure of the under bump metal layer 106 and the bump structure 107 may be more stable and the bump structure 107 may unlikely peel off from the under bump metal layer 106, thus the structure may further improve the mechanical stability of the packaged structure and also increase the thermal conductivity and the electric conductivity of the packaged structure.

In one embodiment, the under bump metal layer 106 is formed by using an electroplating method. In addition, the under bump metal layer 106 may be made of Cu, Au, Ag, Sn, or Ni.

Further, the material used to form the under bump metal layer 106 is different from the material used to form the metal core 105 so that when the two metals contact with each other, atoms in one material may diffuse into the other, and vice versa. Therefore, an intermetallic compound (IMC) may be thrilled at the interface of the two metallic materials, thus may further improve the bonding strength between the two metals. That is, the bonding strength between the under bump metal layer 106 and the metal core 105 may be further improved.

Finally, referring to FIG. 6, the packaged semiconductor structure further includes a bump structure 107 formed on the surface of the under bump metal layer 106.

In one embodiment, the bump structure 107 is a spherical bump structure, i.e., a soldering ball. In certain other embodiments, the bump structure 107 may have a different shape. For example, the bump structure 107 may have a cylindrical profile.

The bump structure 107 may be made of Cu, Au, Ag, Sn, Ni. Further, the material used to form the bump structure 107 is different from the material used to form the under bump metal layer 106. For a similar purpose as using different materials to form the under bump metal layer 106 and the metal core 105, using different materials to form the bump structure 107 and the under bump metal layer 106 may lead to formation of an intermetallic compound (IMC) at the interface of the two metallic materials, thus the bonding strength between the bump structure 107 and the under bump metal layer 106 may be further improved.

Compare to methods and structures in the current technology, the disclosed method and structure may demonstrate several advantages for wafer-level packaging.

Specifically, according to the disclosed method, a metal core is formed on the conductive metal pad while the metal core protrudes from the surface of the substrate; then, an under bump metal layer is formed to cover the top and the side surfaces of the metal core; and finally, a bump structure is formed on the surface of the under bump metal layer. That is, because the metal core covered protrudes from the surface of the substrate while the top and the side surfaces of the metal core is covered by the under bump metal layer, the contact region between the bump structure and the under bump metal layer may be increased. As a comparison, in the current technology, only the top flat surface of the under bump metal layer is in contact with the bump structure. In addition, in the disclosed method and structure, a portion of the metal core covered by the under bump metal layer extends into the bump structure, thus the bonding strength between the bump structure and the under bump metal layer may be increased. Therefore, the mechanical stability of the packaged structure may be improved while the thermal conductivity and the electric conductivity of the packaged structure may also be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for wafer-level packaging, comprising:
    providing a substrate with a conductive metal pad formed on a surface of the substrate;
    forming a metal core on top of the conductive metal pad with the metal core protruding from the surface of the substrate;
    forming an under bump metal layer on a top surface and a side surface of the metal core and directly on a portion of top surface of the conductive metal pad that surrounds the metal core; and
    forming a bump structure on a top of the under bump metal layer, wherein an upper portion of the metal core covered by the under bump metal layer is extended into the bump structure.

2. The method according to claim 1, wherein providing the substrate further includes:
    forming a passivation layer on the surface of the substrate with the portion of the top surface of the conductive metal pad exposed in a hole formed in the passivation layer.

3. The method according to claim 2, wherein providing the substrate also includes:
    forming a protective layer on the top of the passivation layer with the portion of the top surface of the conductive metal pad exposed in a hole formed in the protective layer, wherein:
        the conductive metal pad, the passivation layer, and the protective layer together form an opening to expose the portion of the top surface of the conductive metal pad.

4. The method according to claim 3, wherein forming the metal core includes:
    forming the metal core on a bottom surface of the opening.

5. The method according to claim 3, wherein the protective layer is made of polyimide.

6. The method according to claim 3, wherein a top surface of the metal core is higher than a top surface of the protective layer.

7. The method according to claim 3, further comprises:
    forming the metal core on the portion of the top surface of the conductive metal pad;
    forming a spatial interval separating a sidewall of the metal core from sidewalls of the passivation layer and the protective layer; and
    completely filling the under bump metal layer into the spatial interval.

8. The method according to claim 2, wherein the passivation layer is made of silicon nitride (SiN), borosilicate glass (BSG), phosphorosilicate glass (PSG), or boron-phosphorosilicate glass (BPSG).

9. The method according to claim 1, wherein forming the metal core further includes:
    forming an electroplating seed layer on the substrate;
    forming a photo-resist layer on a top of the electroplating seed layer;
    removing a portion of the photo-resist layer to expose a portion of the electroplating seed layer corresponding to the conductive metal pad;
    performing an electroplating process to form the metal core on a surface of the portion of the electroplating seed layer corresponding to the conductive metal pad; and
    removing the photo-resist layer and a portion of the electroplating seed layer under the photo-resist layer.

10. The method according to claim 1, wherein forming the under bump metal layer to cover the top surface and the side surface of the metal core includes:
    forming the under bump metal layer by using an electroplating method.

11. The method according to claim 1, wherein forming the bump structure includes:
    forming the bump structure through a ball-planting and back-flow process.

12. The method according to claim 1, wherein a material used to form the metal core is different from a material used to form the under bump metal layer.

13. The method according to claim 1, wherein a material used to form the under bump metal layer is different from a material used to form the bump structure.

14. The method according to claim 1, further comprises:
    forming an intermetallic compound layer at an interface of the metal core and the under bump metal layer.

* * * * *